United States Patent
Jung

(10) Patent No.: US 9,010,972 B2
(45) Date of Patent: Apr. 21, 2015

(54) ORGANIC LIGHT EMITTING DISPLAY DEVICE

(71) Applicant: LG Display Co., Ltd., Seoul (KR)

(72) Inventor: Gi Hyon Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 72 days.

(21) Appl. No.: 14/035,591

(22) Filed: Sep. 24, 2013

(65) Prior Publication Data

US 2014/0085907 A1 Mar. 27, 2014

(30) Foreign Application Priority Data

Sep. 24, 2012 (KR) ............ 10-2012-0106074
Sep. 17, 2013 (KR) ............ 10-2013-0111762

(51) Int. Cl.
*F21V 21/00* (2006.01)
*H05K 5/03* (2006.01)
*G09G 3/32* (2006.01)

(52) U.S. Cl.
CPC .............. *H05K 5/03* (2013.01); *G09G 3/3208* (2013.01)

(58) Field of Classification Search
CPC ........ G09G 3/3208; H05K 5/03; G06F 13/00; G02F 1/133308; G02F 1/133502; H01L 51/5212; H01L 51/5246; F21V 21/002; F21V 21/096; F21Y 2101/02; F21Y 2105/008; F21S 2/00
USPC ............ 362/362, 368, 374, 398, 184, 249.03, 362/84, 97.3; 340/381, 225, 815.55, 340/286.13, 525, 815.77
See application file for complete search history.

(56) References Cited

U.S. PATENT DOCUMENTS

| | | | |
|---|---|---|---|
| 5,049,870 A * | 9/1991 | Fitzgerald et al. ........ | 340/815.55 |
| 8,319,729 B2 * | 11/2012 | Choi et al. ................. | 345/158 |
| 2007/0132910 A1 * | 6/2007 | Liao ........................... | 349/58 |
| 2008/0285220 A1 * | 11/2008 | Tai et al. .................... | 361/681 |
| 2010/0020042 A1 * | 1/2010 | Stelandre et al. .......... | 345/174 |
| 2010/0151601 A1 * | 6/2010 | Park et al. .................. | 438/26 |
| 2012/0081629 A1 * | 4/2012 | Mock .......................... | 349/58 |
| 2013/0010482 A1 * | 1/2013 | Choi ........................... | 362/398 |
| 2013/0057559 A1 * | 3/2013 | Kim et al. .................. | 345/519 |

FOREIGN PATENT DOCUMENTS

JP 2009076387 A * 4/2009

\* cited by examiner

*Primary Examiner* — Anne Hines
*Assistant Examiner* — Jose M Diaz
(74) *Attorney, Agent, or Firm* — Birch, Stewart, Kolasch & Birch, LLP

(57) ABSTRACT

An organic light emitting display device is disclosed which includes a magnet inserted into a bottom cover. The magnet is used to combine an organic light emitting display panel with a support means which is used to support the organic light emitting display panel and includes an upper cover, the bottom cover and a side cover. A sealing member included in the organic light emitting display panel is fastened to the bottom cover by a magnetic force of the magnet. As such, it is easy to separate the organic light emitting display panel and the support means from each other when a fault is generated in any component. In accordance therewith, the manufacturing process can be simplified and the faulty component can be easily replaced with a normal component. As a result, the manufacturing costs of the organic light emitting display device can be reduced.

20 Claims, 13 Drawing Sheets

ORGANIC LIGHT EMITTING DISPLAY DEVICE

The present application claims priority under 35 U.S.C. §119(a) of Korean Patent Application Nos. 10-2012-0106074 filed on Sep. 24, 2012, and 10-2013-0111762 filed on Sep. 17, 2013, which are all hereby incorporated by reference in their entirety.

BACKGROUND

1. Field of the Disclosure

The present application relates to an organic light emitting display device.

2. Description of the Related Art

Nowadays, a variety of display devices are being developed. The display devices include liquid crystal display (LCD) devices, plasma display panel devices, organic light emitting display (OLED) device, electroluminescent display devices and so on.

Among these display devices, OLED devices have the features of lower power consumption, wider viewing angle, lighter weight and higher brightness compared to LCD devices. As such, the OLED device is considered to be next generation display devices.

The OLED device allows an OLED panel and a bottom cover to be combined with each other by means of a double-sided tape. If a fault is generated in the OLED panel and so on during a manufacturing process, it is difficult to separate a sealing member and the bottom cover from each other due to the strong adhesive force of the double-sided tape. As such, the OLED device can be easily damaged. Therefore, the productivity of the OLED device can deteriorate. Furthermore, there is a problem often generating misalignment between the OLED panel and the bottom cover in a curved type OLED device due to the double-sided tape.

BRIEF SUMMARY

Accordingly, embodiments of the present application are directed to an OLED device that substantially obviates one or more of problems due to the limitations and disadvantages of the related art.

The embodiments are to provide an OLED device which can be easy to combine and separate an OLED panel and a bottom cover with and from each other.

Also, the embodiments are to provide an OLED device which is adapted to enhance productivity.

Furthermore, the embodiments are to provide an OLED device which is adapted to prevent misalignment.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a first general aspect of the present embodiment, an organic light emitting display device includes: a display panel configured to include a substrate and a sealing member; a bottom cover disposed under the display and configured to support the display panel; and at least one magnet disposed in the bottom cover in order to fasten the display panel to the bottom cover.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
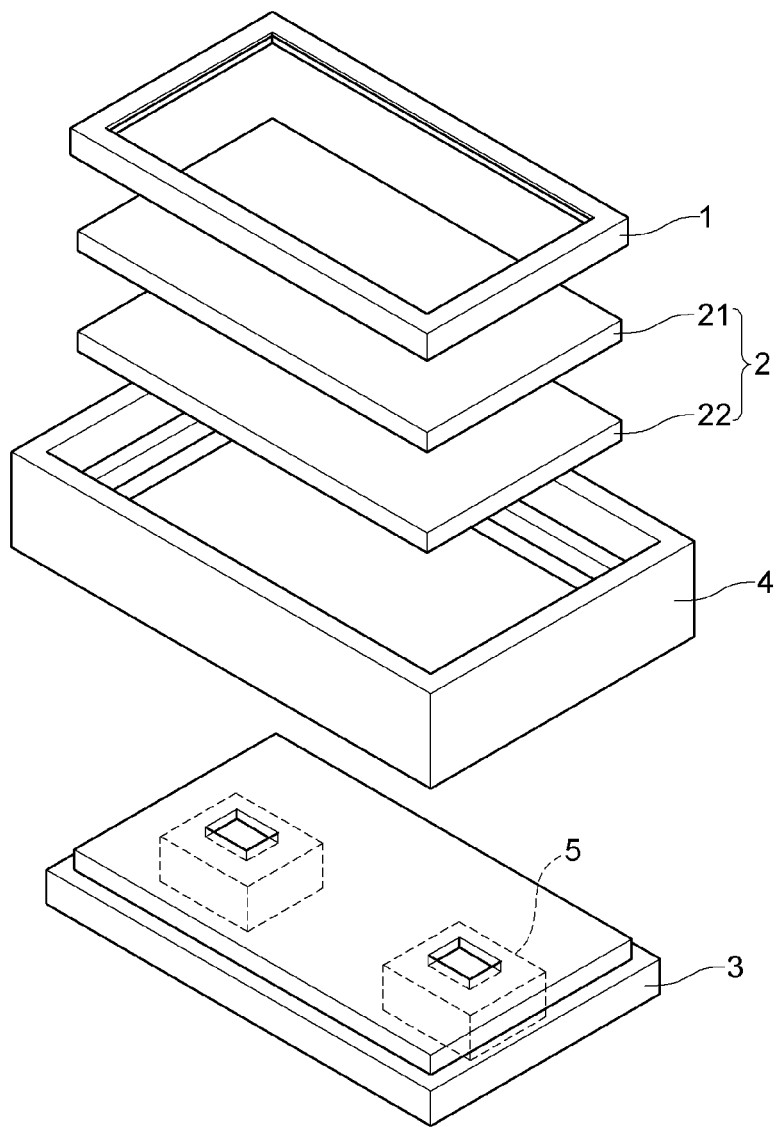
FIG. 1 is a disassembled perspective view showing an OLED device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 2:
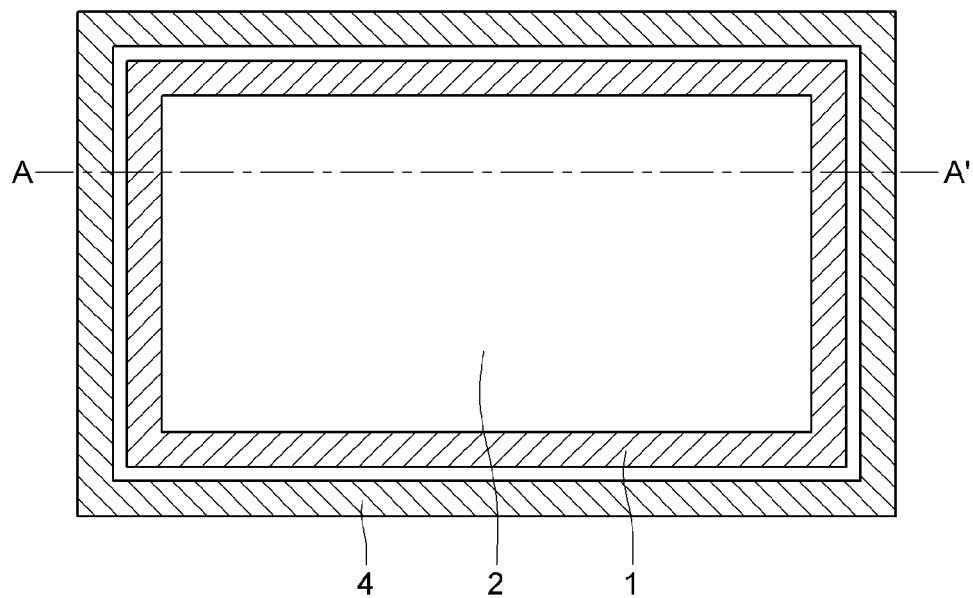
FIG. 2 is a planar view showing the OLED device of FIG. 1.
Figure 3:
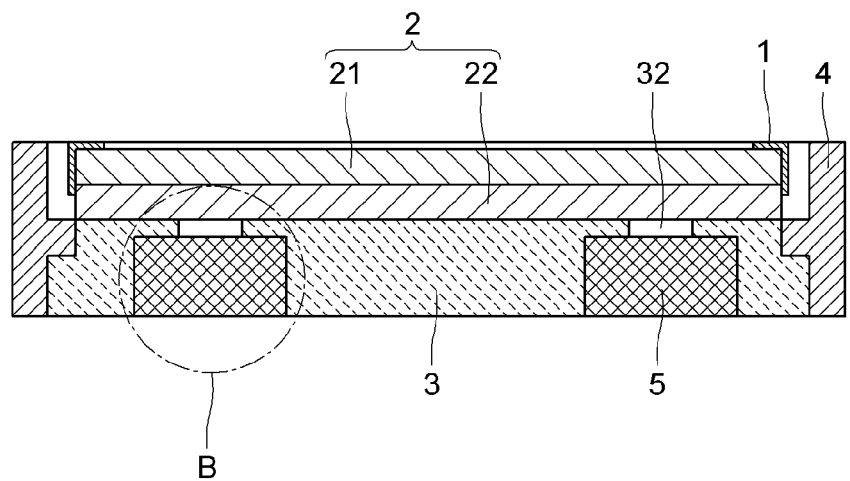
FIG. 3 is a cross-sectional view showing an OLED device, which is taken along a line A-A' in FIG. 2, according to a first embodiment of the present disclosure.

FIG. 1 is a disassembled perspective view showing an OLED device according to an embodiment of the present disclosure. FIG. 2 is a planar view showing the OLED device of FIG. 1. FIG. 3 is a cross-sectional view showing an OLED device, which is taken along a line A-A' in FIG. 2, according to a first embodiment of the present disclosure.

Referring to FIGS. 1 through 3, the OLED device according to a first embodiment of the present disclosure can include an upper cover 1, an OLED panel 2, a bottom cover 3 and a side cover 4.

The OLED panel 2 can be used to display images. The OLED panel 2 can include a thin film transistor substrate 21 and a sealing member 22.

The thin film transistor substrate 21 can include a plurality of pixels which are defined by a plurality of gate lines and a plurality of data lines. Each of the pixels can include a thin film transistor (not shown) and an organic light emission diode (not shown).

The sealing member 22 can be used to protect a variety of lines and elements arranged in the thin film transistor substrate 21. More specifically, the organic light emission diodes formed on the thin film transistor substrate 21 are weak against moisture and/or oxygen. As such, the life span of the OLED device can be reduced due to moisture and/or oxygen. In view of this point, the sealing member 22 is disposed on the thin film transistor substrate 21 and used to protect the organic light emission diodes from moisture and/or oxygen.

The sealing member 22 can be formed from an alloy of iron and nickel Ni, but it is not limited to this. The sealing member 22 can be disposed in such a manner as to either contact the rear surface of the thin film transistor substrate 21 or be separated from the rear surface of the thin film transistor substrate 21, but it is not limited to this.

If the sealing member 22 is disposed in such a manner as to contact the rear surface of the thin film transistor substrate 21, a passivation layer can be used to prevent the generation of an electrical short circuit between the sealing member 22 and the thin film transistor substrate 21. In this case, the passivation layer can be formed on the rear surface of the thin film transistor substrate 21. However, the present embodiment is not limited to this.

The OLED panel 2 can be driven in one of a top light emission mode and a bottom light emission mode, but it is not limited to this. The top light emission mode enables light to be emitted toward the sealing member 22. The bottom light emission mode enables light to be emitted in a downward direction of the thin film transistor substrate 21.

The upper cover 1 can be used to support and protect the OLED panel 2. To this end, the upper cover 1 can be disposed along side surfaces and upper surface edges of the OLED panel 2. The OLED panel 2 can be combined with the upper cover 1 in such a manner as to be inserted into the upper cover 1. At least one screw or hook (or protrusion) can be used in the combination of the OLED panel 2 and the upper cover 1, but the present embodiment is not limited to this.

The bottom cover 3 can be used to support the OLED panel 2. To this end, the bottom cover 3 can be disposed under the OLED panel 2 and opposite to the upper cover 1. Such a bottom cover 3 can be formed from either a metal material, such as stainless steel, or a plastic material, but it is not limited to this.

The side cover 4 can be combined with the bottom cover 3 and used to protect the side surfaces of the OLED panel 2, but it is not limited to this. Also, the side cover 4 can be formed separately from or integrately with the bottom cover 3, but it is not limited to this. Moreover, the side cover 4 can be formed to have a larger size than that of the upper cover 1, but it is not limited to this.

If the upper cover 1 and the OLED panel 2 are received into the side cover 4, a gap can be provided between an inner side surface of the side cover 4 and an outer side surface of the upper cover 1. The gap can have a range of 0.3~1.0 mm, but it is not limited to this. In this case, the side cover 4 can be combined with the upper cover 1 in such a manner as to contact the upper cover 1. For example, the upper cover 1 and the side cover 4 can be combined with each other by screws or a tape, but the present embodiment is not limited to these.

The OLED device can further include a plurality of magnets 5 fastened into the bottom cover 3. As such, the bottom cover 3 can be combined with the sealing member 22 of the OLED panel 2 by magnetic forces of the plural magnets 5. Therefore, the bottom cover 3 can support the OLED panel 2.

The plurality of magnets 5 can be arranged separately from one another. More specifically, the plurality of magnets 5 can be arranged in a fixed interval or a random shape, but it is not limited to this.

In this manner, the OLED device allows the bottom cover 3 and the OLED panel 2 to be combined with each other by the magnetic forces of the magnets 5 arranged in the bottom cover 3. As such, the upper cover 1, which is used as an independent component for supporting the OLED panel 2, can be removed.

Figure 4:
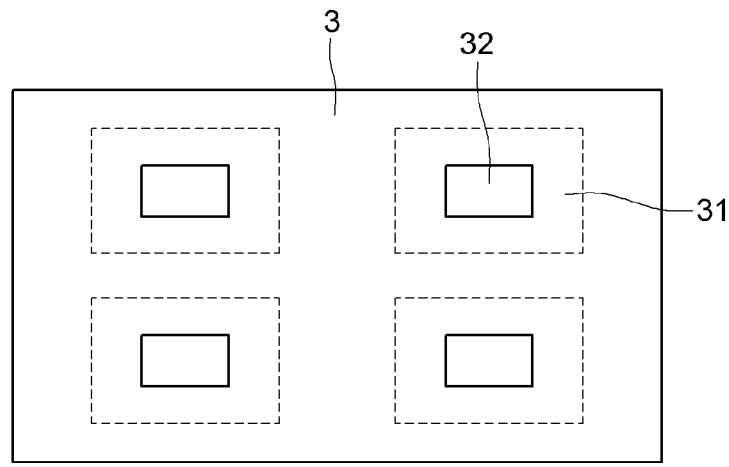
FIG. 4 is a planar view showing the bottom cover in FIG. 3.

FIG. 4 is a planar view showing the bottom cover in FIG. 3.

Referring to FIG. 4, at least one first hole 31 can be randomly formed in the lower surface of the bottom cover 3. The first hole 31 can receive a magnet (not shown). Also, at least one second hole 32 can be formed in the upper surface of the bottom cover 3 in such a manner as to be connected to the first hole 31. The first and second holes 31 and 32 can be formed in one of a tetragonal shape, a circular shape and so on, but they are not limited to these.

Figure 5:
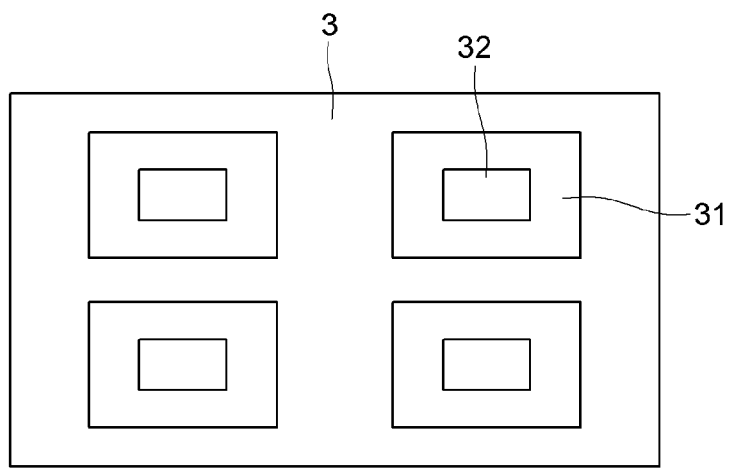
FIG. 5 is a base view show the bottom cover in FIG. 3.

FIG. 5 is a base view show the bottom cover in FIG. 3.

As shown in FIG. 5, the magnet 5 can be inserted into the first hole 31 which is formed in the lower surface of the bottom cover 3. If the bottom cover 3 is formed from a metal material, the magnet 5 within the first hole 31 can be fastened to the bottom cover 3 by its magnetic force. The first magnet 5 is formed in a shape matching with the first hole 31. Such the magnet 5 can be formed in a shape opposite to that of the first hole 31, but it is not limited to this. Also, the magnet 5 can be formed smaller than the first hole 31 but larger than the second hole 32. Because the second hole 32 has a smaller size than that of the first hole 31, the magnet 5 can be disposed into the first hole 31 without passing through the second hole 32. As such, the magnetic force of the magnet 5 can be applied to the upward direction of the bottom cover 3 through the second hole 32.

Figure 6A:
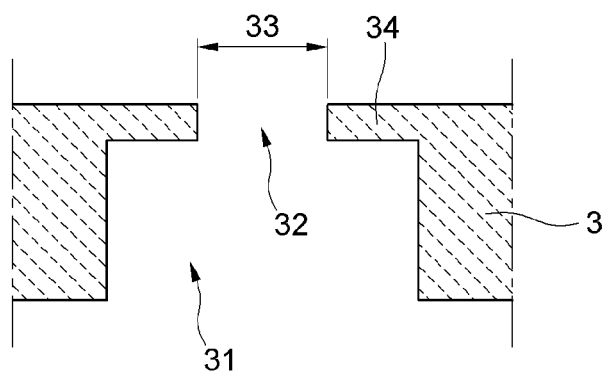
FIGS. 6A, 6B, 7A, 7B, 8A, 8B, 9A and 9B are cross-sectional views illustrating examples of a region B in FIG. 3.

FIG. 6A is a cross-sectional view showing an example of the region "B" of FIG. 3 before inserting the magnet.

As shown in FIG. 6A, the width 33 of the second hole 32 is larger than that of the first hole 31. The first and second holes 31 and 32 with the different widths are connected to each other. As such, an obstacle portion 34 can be formed around the second hole 32. In accordance therewith, the magnet 5 inserted into the first hole 31 can be fastened by means of the obstacle portion 34 without passing through the first hole 31 in the upward direction of the bottom cover 3. Therefore, the obstacle portion 34 can be used to fasten the magnet 5 to the inside of the bottom cover 3. Also, the obstacle portion 34 can serve to prevent an impact which can be directly applied to the sealing member (not shown) on the bottom cover 3 when the magnet 5 is inserted into the first hole 31.

Figure 6B:
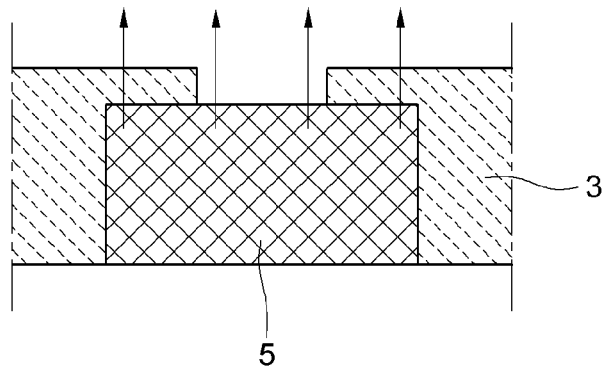

FIG. 6B is a cross-sectional view showing the region "B" of FIG. 3 after inserting the magnet into the first hole of FIG. 6A.

As shown in FIG. 6B, the magnet 5 can provide a magnetic force which acts in an upward direction marked by arrows. The magnetic force of the magnet 5 can enable the sealing member (not shown) to be combined with the bottom cover 3.

Figure 7A:
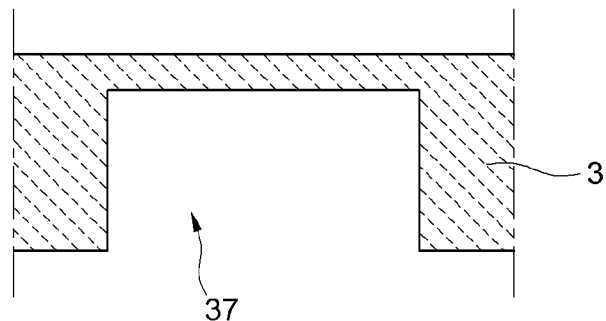
Figure 7B:
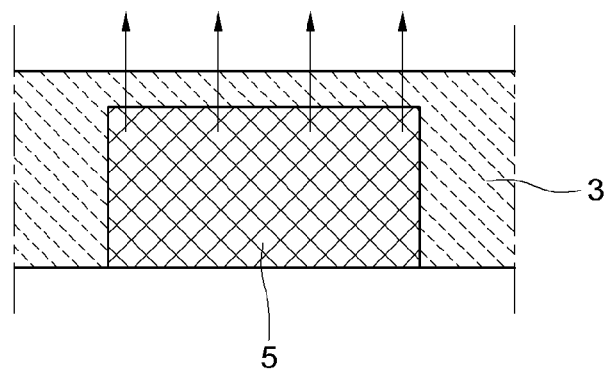

FIGS. 7A and 7B are cross-sectional views showing another example of the region "B" of FIG. 3, unlike that of FIGS. 6A and 6B. FIG. 7A is a cross-sectional view showing the region "B" of FIG. 3 before inserting the magnet. FIG. 7B is a cross-sectional view showing the region "B" of FIG. 3 after inserting the magnet.

The components shown in FIGS. 7A and 7B are the same as those in FIGS. 6A and 6B with the exception of a concave portion 37. As such, the components of FIGS. 7A and 7B having the same function and shape as those of FIGS. 6A and 6B will be referred to by the same reference numbers and names. Also, the description of FIGS. 7A and 7B overlapping with FIGS. 6A and 6B will be omitted.

As shown in FIGS. 7A and 7B, the concave portion 37 can be formed in the lower surface of the bottom cover 3. A magnet 5 can be inserted into the concave portion 37. The magnet 5 can provide a magnetic force which acts in an upward direction marked by arrows. As such, the bottom cover 3 and the sealing member (not shown) can be combined with each other by the magnetic force of the magnet 5.

Figure 8A:
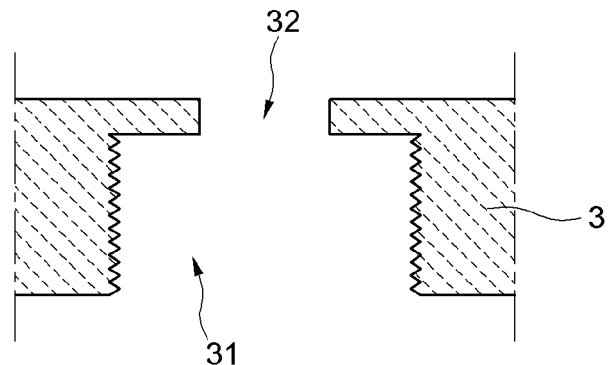
Figure 8A:
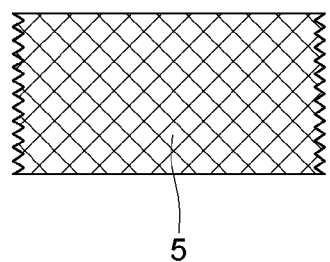
Figure 8B:
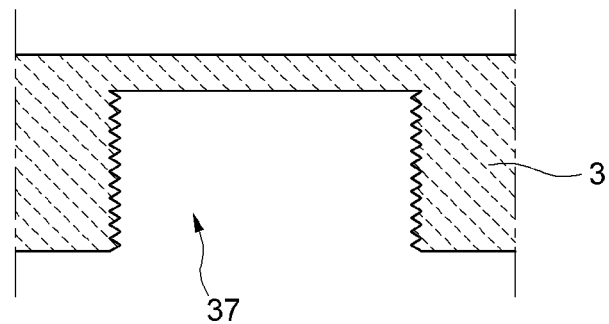
Figure 8B:
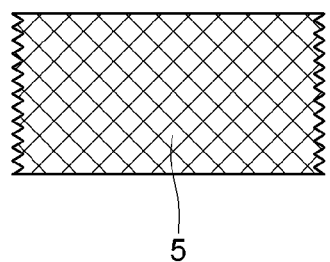

FIGS. 8A and 8B are cross-sectional views showing still another example of the region "B" of FIG. 3, unlike those of FIGS. 6A/6B and 7A/7B. FIG. 8A is a cross-sectional view showing the region "B" of FIG. 3 before inserting the magnet. FIG. 8B is a cross-sectional view showing the region "B" of FIG. 3 after inserting the magnet.

Referring to FIG. 8A, the first hole 31 is formed in a screw shape and the first magnet 5 is formed in a screw shape matching with the screw shape of the first hole 31.

Such a first hole 31 can be formed to have a female (or internal) screw shape in the lower surface of the bottom cover 3. The second hole 31 can be connected to a second hole 32 formed in the upper surface of the bottom cover 3. Meanwhile, a magnet 5 can be formed in a male screw shape opposite to the female screw shape. As such, the magnet 5 can be engaged with the first hole 31.

In this manner, the magnet 5 is formed in the male screw shape and the first hole 31 is formed in the female (or internal) screw shape. As such, the magnet 5 can be easily combined with and separated from the bottom cover 3. Also, the concave portion 37 is formed in a screw shape and the first magnet 5 is formed in a screw shape matching with the screw shape of the concave portion 37. Such the magnet 5 with the male screw shape can be fastened to the lower surface of the bottom cover 3 in such a manner as to be inserted into the concave portion 37 with the female screw shape, as shown in FIG. 8B.

Figure 9A:
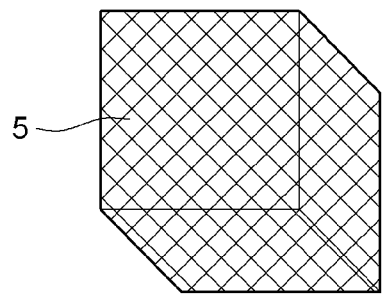

FIG. 9A is a perspective view showing an example of the magnet in FIG. 1. The magnet 5 of FIG. 9A can be formed in a shape opposite to the first hole 31 of FIG. 6A. Alternatively, the magnet 5 can be formed in a shape opposite to the concave portion 37 of FIG. 7A.

Figure 9B:
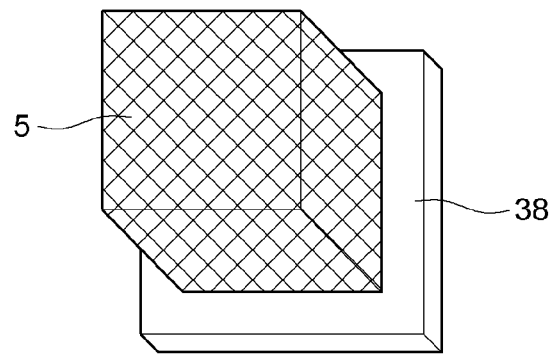

FIG. 9B is a perspective view showing a magnet package which can be applied to the OLED device of FIG. 1. As shown in FIG. 9B, the magnet package includes a magnet 5 and a handle member 38. The magnet 5 can be formed in a shape opposite to either the first hole 31 of FIG. 6A or the concave portion 37 of FIG. 7A. Also, the magnet 5 can be placed on the handle member 38. Also, the magnet 5 can be fastened to the handle member 38 by means of a screw or an adhesive material, but it is not limited to this. The handle member 38 can be drawn by a worker in a state that the magnet 5 is inserted into the first hole 31 or the concave portion 37. As such, the magnet 5 inserted into the first hole 31 or the concave portion 37 can be easily separated from the bottom cover 3 by drawing the handle member 38.

Figure 10:
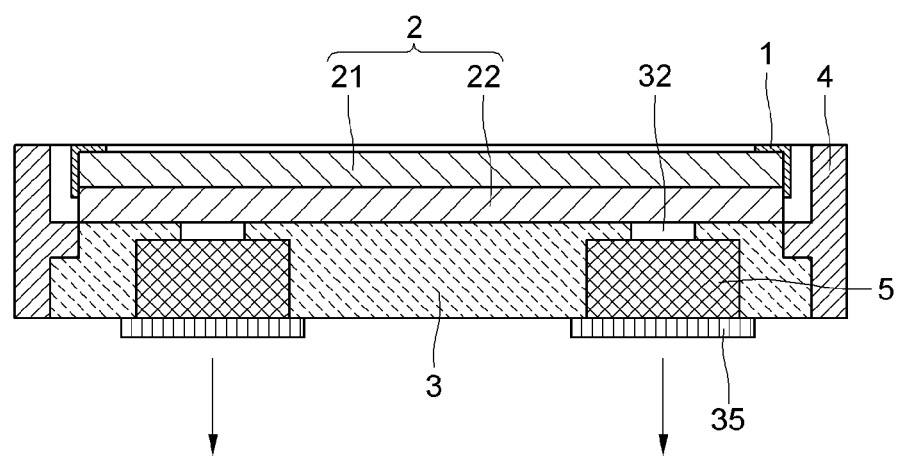
FIG. 10 is a cross-sectional view showing an OLED device, which is taken along a line A-A' in FIG. 2, according to a second embodiment of the present disclosure.

FIG. 10 is a cross-sectional view showing an OLED device, which is taken along a line A-A' in FIG. 2, according to a second embodiment of the present disclosure.

The OLED device of the second embodiment is the same as that of the first embodiment with the exception of magnet covers 35. The components of the second embodiment having the same function and shape as those of the first embodiment will be referred to by the same reference numbers and names. Also, the description of the second embodiment overlapping with the first embodiment will be omitted.

Referring to FIG. 10, the magnet covers 35 each covering the first holes 31 can be arranged on the lower surface of the bottom cover 3. The magnet cover 35 can serve to stop up the first hole 31 into which the magnet 5 is inserted. The magnet cover 35 can be formed in such a manner as to be separated from the magnet 5. The magnet 5 can be fastened to magnet cover 35 by means of one of a screw and an adhesive material. Alternatively, the magnet cover 35 can be formed in a single body united with the magnet 5. As such, the magnet 5 fastened to or united with the magnet cover 35 can be separated from bottom cover 3 by drawing the magnet cover 35 in an arrow direction.

Also, the magnet cover 35 can be applied to the bottom cover 3 which is provided with the concave portion 37 instead of the first hole 31. In this case, the magnet cover 35 can serve to stop up the concave portion 37 into which the magnet 5 is inserted. The magnet cover 35 can be formed in such a manner as to be separated from or united with the magnet 5, as described above.

Figure 11:
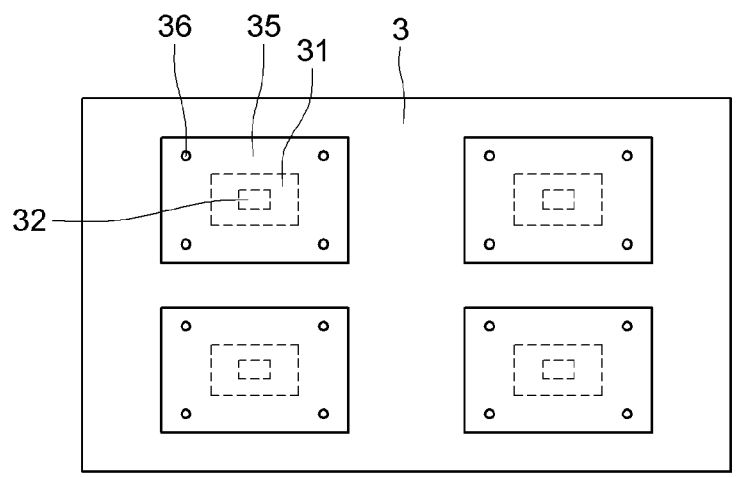
FIG. 11 is a base view show the bottom cover in FIG. 10.

FIG. 11 is a base view show the bottom cover in FIG. 10.

As shown in FIG. 11, the magnet 5 is inserted into the first hole 31 of the bottom cover 3 before the magnet cover 35 is used to stop up the first hole 31. The magnet cover 35 disposed to stop up the first hole 31 can be fastened to the lower surface of the bottom cover 3 by screws 36. In order to separate the OLED panel 2 and the bottom cover 3 from each other, the magnet inserted into the first hole 31 can be removed from the bottom cover 3 by unscrewing the screws 36 stuck into the bottom cover 3 and opening the magnet cover 35.

Also, the magnet cover 35 can be applied to the bottom cover 3 which is provided with the concave portion 37 instead of the first hole 31. In this case, the magnet cover 35 can serve to stop up the concave portion 37 into which the magnet 5 is inserted, in the above-mentioned manner. The detailed description about the concave portion 37 closed up by the magnet cover 35 will be omitted.

Figure 12:
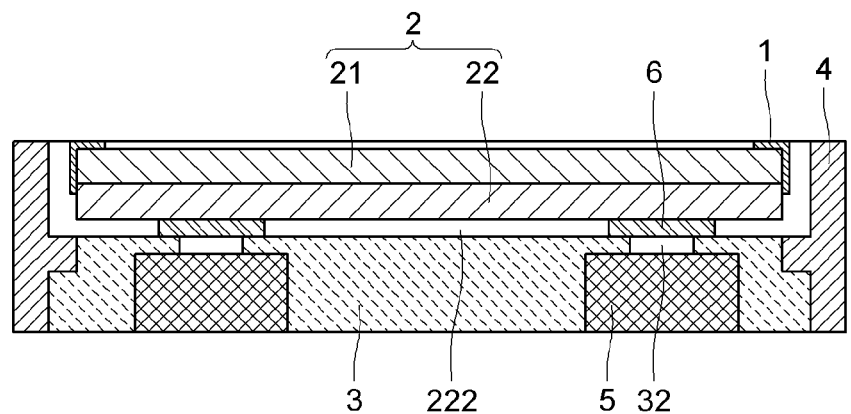
FIG. 12 is a cross-sectional view showing an OLED device, which is taken along a line A-A' in FIG. 2, according to a third embodiment of the present disclosure.

FIG. 12 is a cross-sectional view showing an OLED device, which is taken along a line A-A' in FIG. 2, according to a third embodiment of the present disclosure.

The OLED device of the third embodiment is the same as that of the first embodiment with the exception of second magnets 6. The components of the third embodiment having the same function and shape as those of the first embodiment will be referred to by the same reference numbers and names. Also, the description of the third embodiment overlapping with the first embodiment will be omitted.

As shown in FIG. 12, first magnets 5 can be inserted into the inside of the bottom cover 3. Also, a plurality of second magnets 6 can be arranged on the upper surface of the bottom cover 3. The second magnet 6 can be disposed at a position of the upper surface of the bottom cover 3 opposite to the first magnet 5. The second magnet 6 can be attached to the upper surface of the bottom cover 3 by an attractive power which is derived from the magnetic forces of the first and second magnets 5 and 6. As such, the sealing member 22 can be fastened to the bottom cover 3 by the first and second magnets 5 and 6. An empty space (222), in which the second magnets 6 are not disposed, between the sealing member 22 and the bottom cover 3 can serve to easily discharge heat generated in the thin film transistor substrate 21.

Alternatively, the second magnet 6 can be formed in a smaller size than that of the second hole 32. In this case, the second magnet 6 can come in direct contact with the first magnet 5. As such, a power fastening the sealing member 22 to the bottom cover 3 can be enhanced.

Figure 13:
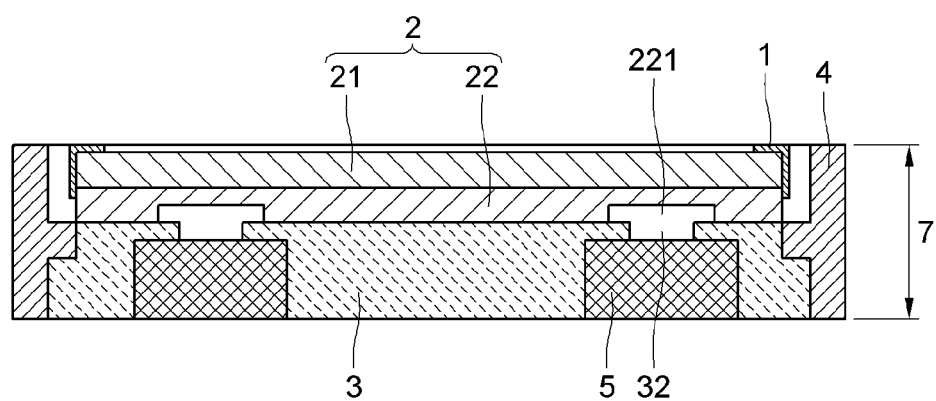
FIG. 13 is a cross-sectional view showing an OLED device, which is taken along a line A-A' in FIG. 2, according to a fourth embodiment of the present disclosure.

FIG. 13 is a cross-sectional view showing an OLED device, which is taken along a line A-A' in FIG. 2, according to a fourth embodiment of the present disclosure.

As shown in FIG. 13, second concave portions 221 adapted to receive the second magnets (not shown) can be formed in the lower surface of the sealing member 22. Because the second magnets are inserted into the second concave portions 221, any space is not formed between the sealing member 22 and the bottom cover 3. As such, the thickness of the OLED device can be reduced. The second concave portions 221 can be formed in one of a tetragonal shape, a circular shape and so on, but they are not limited to these. The second magnet not shown in the drawing can be disposed at a position of the lower surface of the sealing member 22 opposite to the first magnet 5. The second magnet (not shown) can be formed to have an upper portion inserted into the second concave portion 221 and a lower portion inserted into the second hole 32, but it is not limited to this.

Figure 14A:
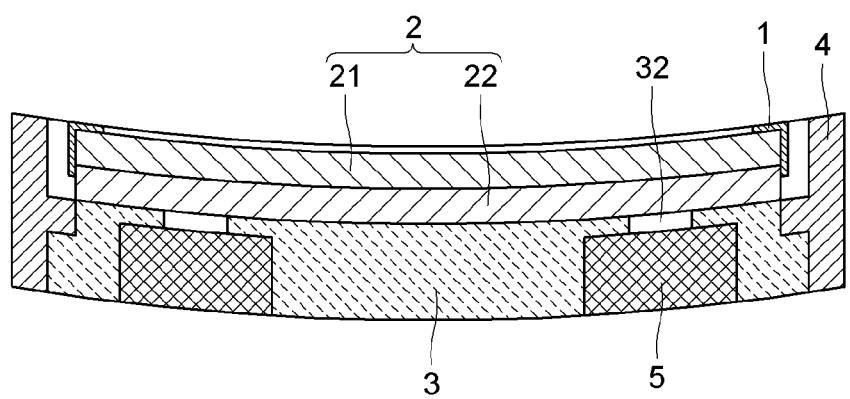
FIG. 14A is a cross-sectional view showing a curved type OLED device, which is taken along a line A-A' in FIG. 2, according to a fifth embodiment of the present disclosure.

FIG. 14A is a cross-sectional view showing a curved type OLED device, which is taken along a line A-A' in FIG. 2, according to a fifth embodiment of the present disclosure.

The OLED device of the fifth embodiment is similar to those of the first through fourth embodiments with the exception of magnet covers 35. The components of the fifth embodiment having the same function and shape as those of the first embodiment will be referred to by the same reference numbers and names. Also, the description of the fifth embodiment overlapping with the first embodiment will be omitted.

Referring to FIG. 14A, the OLED device of the fifth embodiment includes: an OLED panel 2 curved in a first curvature; an upper cover 1 curved in the first curvature and disposed to encompass upper edges of the OLED panel 2; a bottom cover 3 curved in a second curvature, disposed under the OLED panel, and configured to support the OLED panel 2; and a side cover 4 linked with the bottom cover 3 and configured to support the OLED panel 2. A plurality of magnets 5 are arranged in the lower surface of the bottom cover 3. The magnetic forces of the magnets 5 can enable the OLED panel 2 to be fastened to the bottom cover 3.

Furthermore, second magnets 6 (not shown) can be arranged in the lower surface of the sealing member 22 opposite to the first magnets 5 which are arranged in the lower surface of the bottom cover 3. In this case, the OLED panel 2 can be fastened to the bottom cover 3 by the magnetic forces of the first and second magnet 5 and 6.

The first curvature can be the same as the second curvature. If a viewing position (or point) is set to a distance of 3 m apart from the OLED device, the first curvature "k" can be a range of 1/5000~1/3000, but it is not limited to this. In other words, the first curvature "k" can vary along the size and shape of the OLED device and the viewing distance between a viewer and the OLED device.

Figure 14B:
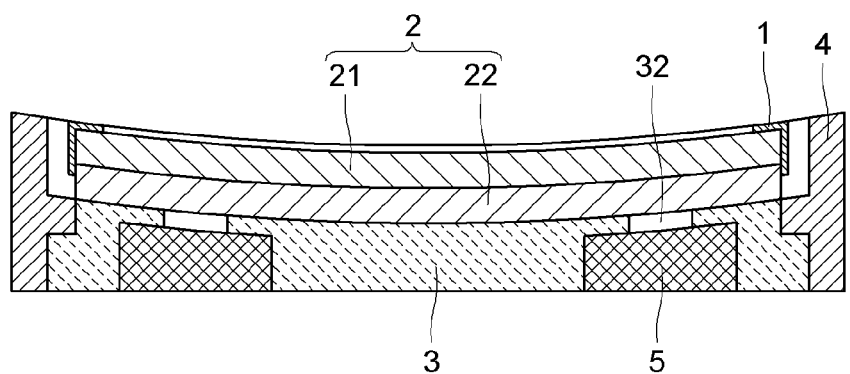
FIG. 14B is a cross-sectional view showing a curved type OLED device, which is taken along a line A-A' in FIG. 2, according to a sixth embodiment of the present disclosure.

FIG. 14B is a cross-sectional view showing a curved type OLED device, which is taken along a line A-A' in FIG. 2, according to a sixth embodiment of the present disclosure. The OLED device of the sixth embodiment is the same as that of the fifth embodiment with the exception of a shape of the bottom cover 3. The components of the sixth embodiment having the same function and shape as those of the fifth embodiment will be referred to by the same reference numbers and names. Also, the description of the sixth embodiment overlapping with the fifth embodiment will be omitted.

As shown in FIG. 14B, the bottom cover 3 can include an upper surface with a second curvature and a lower surface without being curved. The lower surface of the bottom cover 3 can be formed to maintain a consistent horizontality.

In the OLED devices of the first through sixth, the magnet inserted into the bottom cover 3 can be replaced with an electromagnet. In order to drive the electromagnet, a printed circuit board and wirings can be disposed on the bottom cover 3. If the electromagnet is driven, the OLED panel 2 can be fastened to the bottom cover 3. On the contrary, the OLED panel 2 can be separated from the bottom cover 3 when the electromagnet is not driven.

Figure 15A:
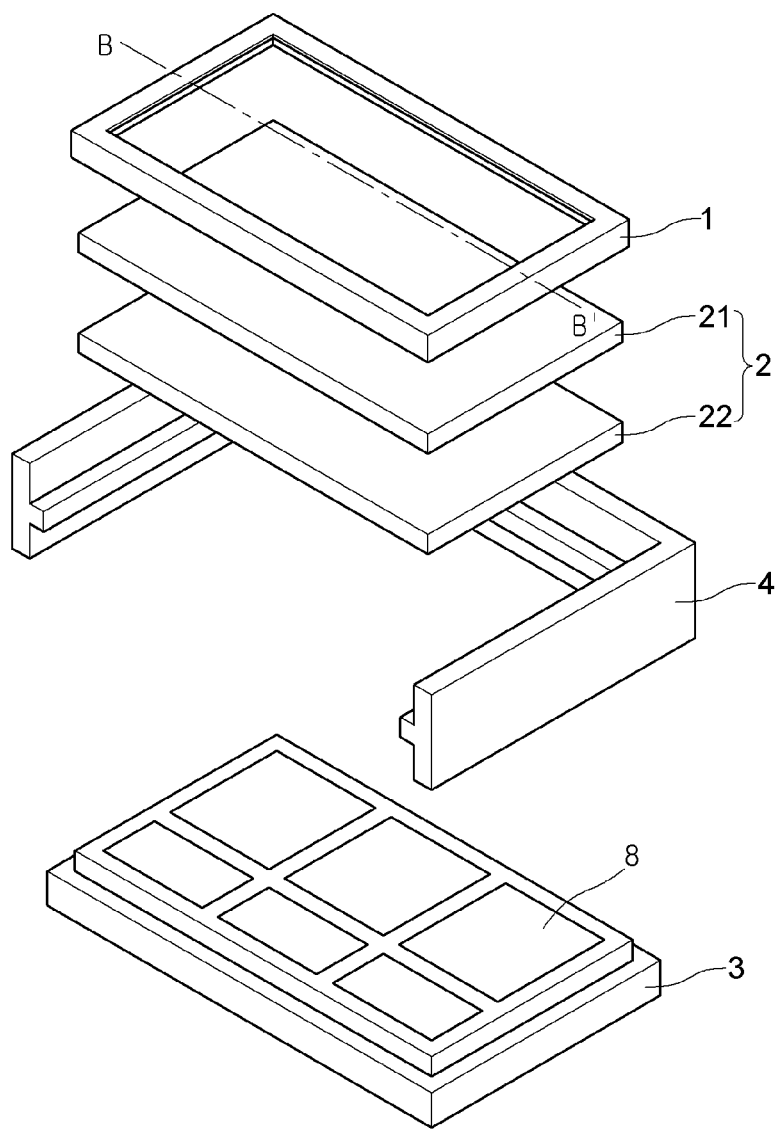
FIG. 15A is a disassembled perspective view showing an OLED device according to a sixth embodiment of the present disclosure.
Figure 15B:
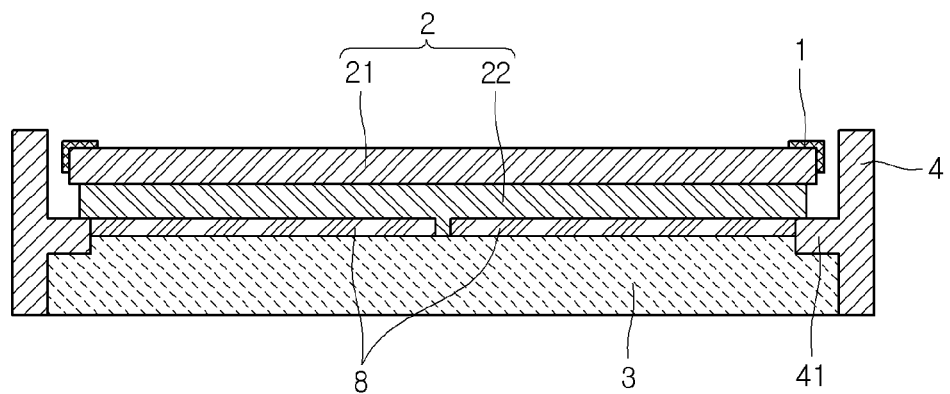
FIG. 15B is a cross-sectional view showing an OLED device which is taken along a line B-B' in FIG. 15A.

FIG. 15A is a disassembled perspective view showing an OLED device according to a sixth embodiment of the present disclosure. FIG. 15B is a cross-sectional view showing an OLED device which is taken along a line B-B' in FIG. 15A.

Referring to FIG. 15A, the OLED device according to a sixth embodiment of the present disclosure can include an upper cover 1, an OLED panel 2, a bottom cover 3, a side cover 4 and at least one third magnet 8.

The upper cover 1 surrounds edges of the upper surface of the OLED panel 2. As such, the upper cover 1 can be used to support and protect the OLED panel 2.

The side cover 4 surrounds side surfaces of the OLED panel 2. Also, the side cover 4 can support the OLED panel 2. Moreover, the side cover 4 can surround three of 4 side surfaces of the bottom cover 3 and expose a single side surface of the bottom cover 3. To this end, the side cover 4 can be formed in such a manner as to open a single side surface. The opened side surface of the side cover 4 can be disposed toward a bottom direction when the OLED device is viewed from a user (or a viewer).

Such a side cover 4 can be divisionally formed in three parts opposite to three side surfaces of the bottom cover 3. In this case, the three parts of the side cover 4 can be combined with the three side surfaces of the bottom cover 3.

Alternatively, the side cover 4 can be formed in a single body shape. As such, the side cover 4 can be combined with the bottom cover 3 by surrounding the girth of the bottom cover 3.

The bottom cover 3 is combined with the side cover 4 and disposed on the rear surface of the OLED panel 2. As such, the bottom cover 3 can support the OLED panel 2.

Such a bottom cover 3 can be formed from a plastic material. Alternatively, the bottom cover 3 can be formed a metal material including aluminum Al.

The OLED panel 2 can include a thin film transistor substrate 21 and a sealing member 22.

The sealing member 22 is disposed on the rear surface of the thin film transistor substrate 21. Also, the sealing member 22 can protect a variety of lines and organic light emission elements which are formed on the thin film transistor substrate 21. Such a sealing member 22 can be formed from an alloy of iron and nickel Ni.

The at least one third magnet 8 is attached to the upper surface of the bottom cover 3. Also, the at least one third magnet 8 can be combined with the rear surface of the sealing member 22 by its magnetic force. As such, the OLED panel 2 including the sealing member 22 can be fixed to the bottom cover 3.

In this manner, the OLED panel 2 is fixed to the bottom cover 3 by the magnetic force of the third magnet 8. As such, the upper cover 1 supporting the OLED panel 2 can be removed. In accordance therewith, the entire thickness of the OLED device can reduced, the fabrication procedure of the OLED device can be simplified, and the fabrication cost of the OLED device can decrease.

Moreover, the side cover 4 can be removed together with the upper cover 1. This results from the fact that the OLED panel 2 can be firmly and accurately fixed to the bottom cover 3. As such, the side cover 4 used to support the OLED panel 2 can be also removed.

As shown in FIG. 15B, the sealing member 22 is formed on the rear surface of the thin film transistor substrate 21 except the edges thereof, it is not limited to this. In other words, the formation position and size of the sealing member 22 can be varied along the shape and/or size of the OLED device and the area of a protective domain of the thin film transistor substrate 21.

A protrusive portion 41 protruding from the inner side surface of the side cover 4 in a horizontal direction can be formed. As such, the sealing member 22 can be placed on the protrusive portion 41 in such a manner that its edges contact the upper surface of the protrusive portion 41.

The at least one third magnet 8 can be disposed in an empty space between the sealing member 22 and the bottom cover 3. As such, the sealing member 22 and the bottom cover 3 can be combined with each other by the magnetic force of the third magnet 8.

Figure 16:
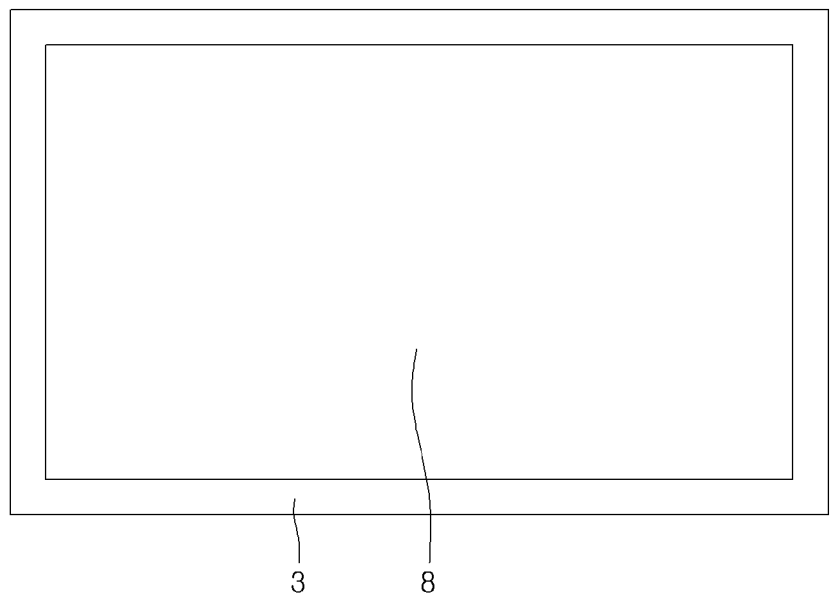
FIGS. 16 through 18 are planar views showing a bottom cover of an OLED device, which has at least one third magnet, according to a sixth embodiment of the present disclosure.
Figure 17:
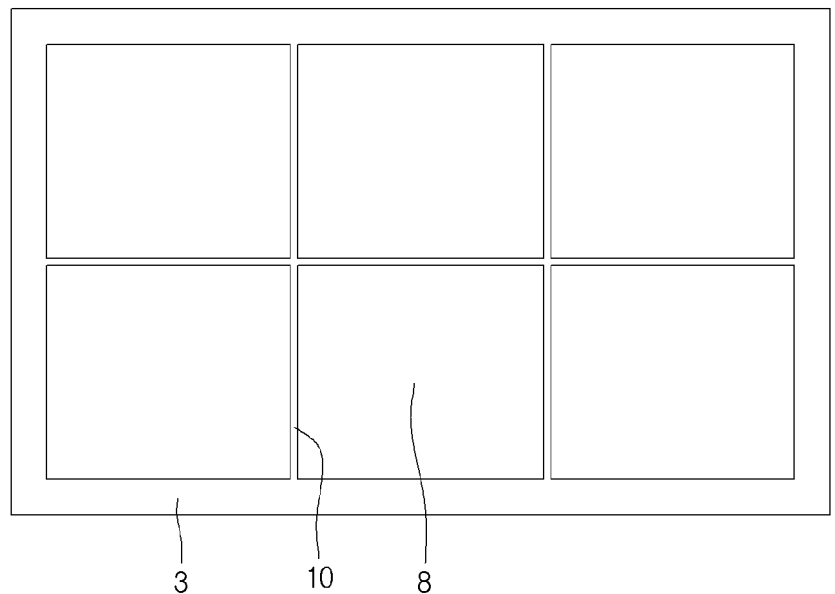
Figure 18:
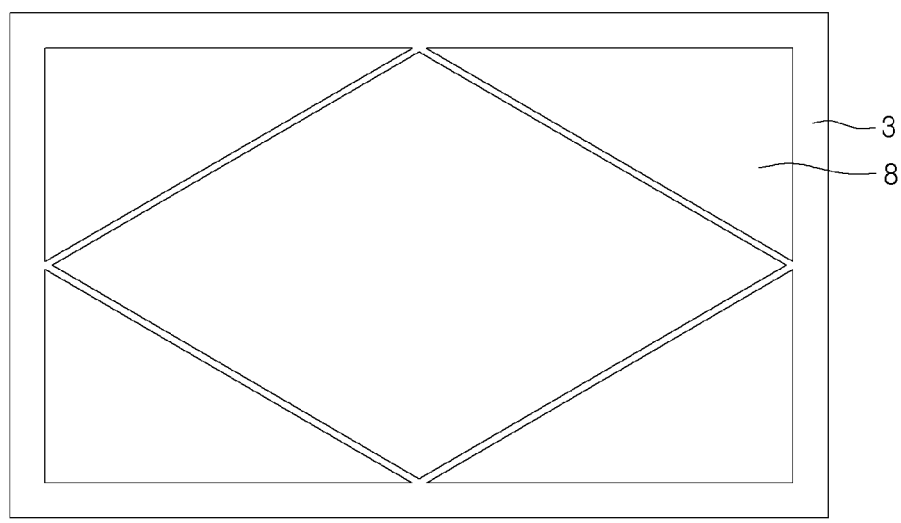

FIGS. 16 through 18 are planar views showing a bottom cover of an OLED device, to which at least one third magnet is attached, according to a sixth embodiment of the present disclosure.

As shown in FIG. 16, a third magnet 8 can be attached to the upper surface of the bottom cover 3.

More specifically, the third magnet 8 can be attached to the entire surface of the bottom cover 3 with the exception of edge regions of the bottom cover 3.

Referring to FIG. 17, a plurality of third magnets 8 are attached to the upper surface of the bottom cover 3.

If the plurality of third magnets 8 are attached to the bottom cover 3 as shown in FIG. 17, an empty space 10 can be generated between the third magnets 8. This results from a fabrication tolerance of the third magnet 8.

Air filled into the empty space 10 can prevent radiation of heat generated in the thin film transistor substrate 21. As such, the empty space 10 is preferably minimized.

When the single third magnet 8 is attached to the bottom cover 3 as shown in FIG. 16, the empty space 10 shown in FIG. 17 cannot be generated. However, the single third magnet 8 being attached to the bottom cover 3 of a large-sized OLED device can be misaligned. To address this matter, the third magnet 8 can be attached to the bottom cover 3 in such a manner as to be divided into a plurality of small magnets, as shown in FIG. 17.

The third magnets 8 shown in FIG. 17 each have a shape of rectangular thin plate. However, the third magnets 8 can be formed in a variety of shapes such as a rhombic shape, a triangular shape and so on, as shown in FIG. 18.

The minimization of the empty space between the third magnets 8 and convenience of work, such as an attachment of the third magnets 8 to the bottom cover 3, must be considered for the shape of the third magnet 8 and so on. As such, the shape and the number of third magnets 8 to be attached to the bottom cover 3 can depend on the minimization of the empty space 10 and the convenience of work.

Figure 19:
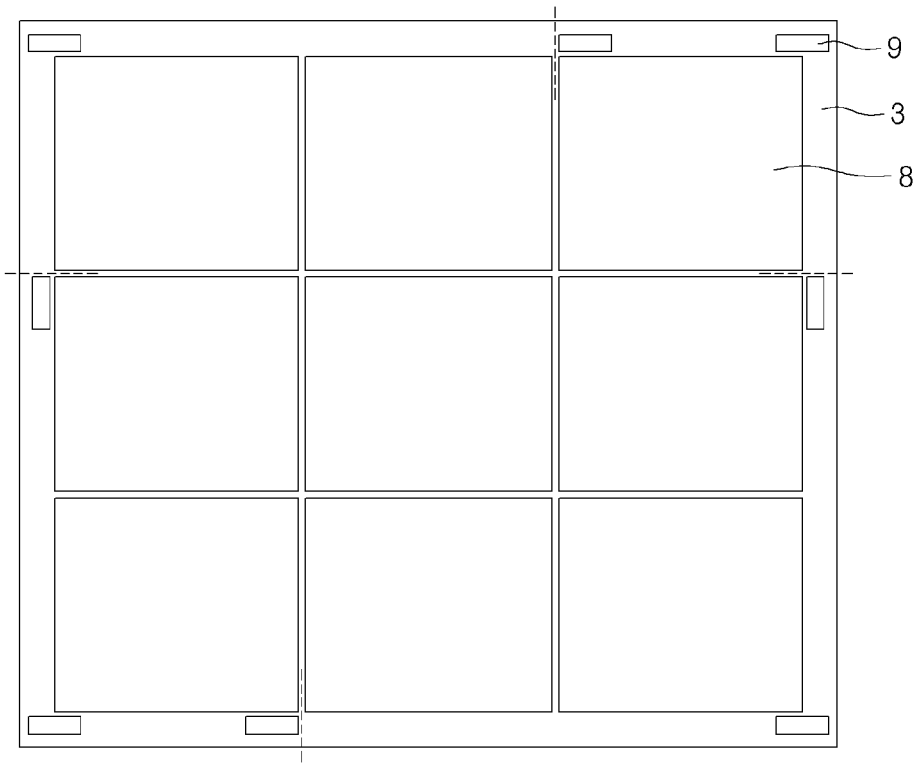
FIG. 19 is a planar view showing a bottom cover with third magnets and fixing members.

FIG. 19 is a planar view showing a bottom cover with third magnets and fixing members.

Referring to FIG. 19, fixing members 9 can be attached to the edge area of the bottom cover 3. The fixing members 9 are used to increase combining force between the edge of the bottom cover 3 and the edge of the sealing member (not shown) when the bottom cover 3 and the sealing member are combined with each other by the third magnets 8. As an example of the fixing member 9, a double-sided adhesive tape can be used.

The fixing members 9 can be attached to corners of the bottom cover 3. Also, the fixing member 9 can be disposed on at least one among top, bottom, left and right edges of the bottom cover 3.

If the fixing member 9 is disposed on at least one among the top, bottom, left and right edges of the bottom cover 3, the fixing member 9 can be attached to a position adjacent to an extension line, which is represented by a dotted line, of the empty space between the third magnets 8.

As such, the combining force between the bottom cover 3 and the sealing member 22 can be maximized by the cohesive forces of the fixing members 9 which are added to the magnetic forces of the third magnets 8.

In a curved type OLED device, the combining force of the bottom cover 3 and the sealing member 22 can become weaker as it goes from a central region to an edge region. In this case, the fixing member 9 can reinforce the combining force between the edge of the bottom cover 3 and the respective edge of the sealing member 22.

Figure 20A:
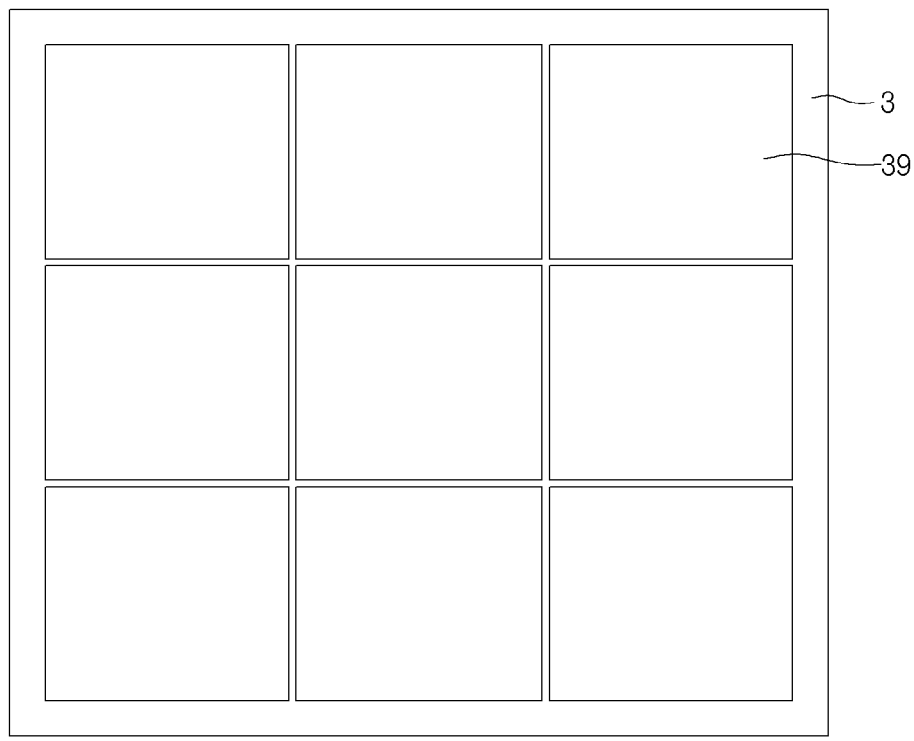
FIG. 20A is a planar view showing a bottom cover according to a seventh embodiment of the present disclosure.
Figure 20B:
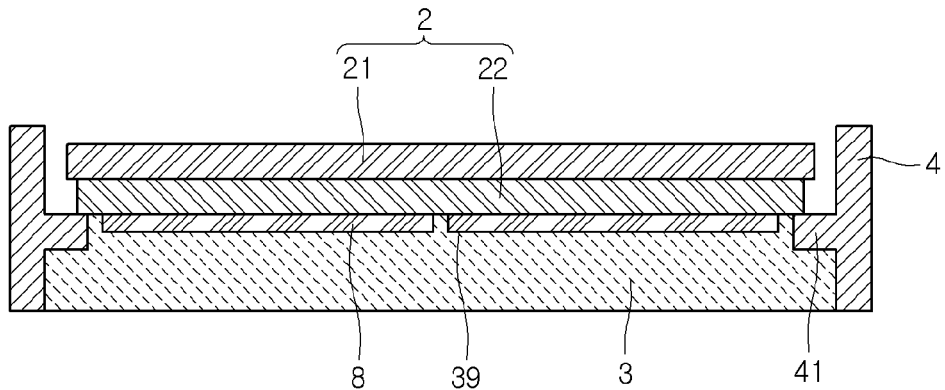
FIG. 20B is a cross-sectional view showing an OLED device according to a seventh embodiment of the present disclosure.

FIG. 20A is a planar view showing a bottom cover according to a seventh embodiment of the present disclosure. FIG. 20B is a cross-sectional view showing an OLED device according to a seventh embodiment of the present disclosure.

Referring to FIGS. 20A and 20B, the bottom cover 3 can be formed to have at least one concave portion 39 adapted to receive the third magnet 8.

The concave portions 39 of the same number as the third magnets 8 can be formed in the bottom cover 3. Also, the concave portion 39 can be formed in a shape opposite to the third magnet 8.

In accordance therewith, the OLED panel 2 can be fastened to the bottom cover 3 by the magnetic forces of the third magnets 8 which are received into the concave portions 39.

Figure 21:
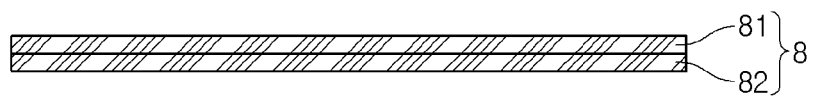
FIG. 21 is a cross-sectional view showing a third magnet according to an embodiment of the present disclosure.

FIG. 21 is a cross-sectional view showing a third magnet 8 according to an embodiment of the present disclosure.

Referring to FIG. 21, the third magnet 8 can include a magnetic member 81 and an adhesive member 82.

The magnetic member 81 having a magnetic property can form one surface of the third magnet 8. The adhesive member 82 can form the other surface of the third magnet 8.

The magnetic member 81 can be attached to the rear surface of the sealing member 22 by its own magnetic force. On the other hand, the adhesive member 82 can be attached to the bottom cover 3 by its own adhesive force.

Also, the magnetic member 81 can have a function of radiating heat.

Such a magnetic member 81 can include graphite. The magnetic member 81 including graphite can not only combine the sealing member 22 and the bottom cover 3, but also radiate (or discharge) heat generated in the thin film transistor substrate 21.

Moreover, the first magnet 5 and the second magnet 6 can include graphite and can also radiate (or discharge) heat generated in the thin film transistor substrate 21.

Figure 22A:
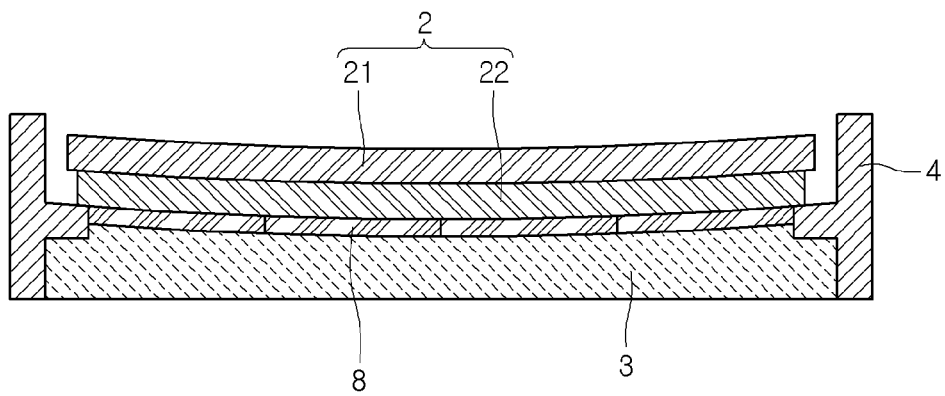
FIGS. 22A and 22B are cross-sectional views showing curved type OLED devices according to an eighth embodiment of the present disclosure.
Figure 22B:
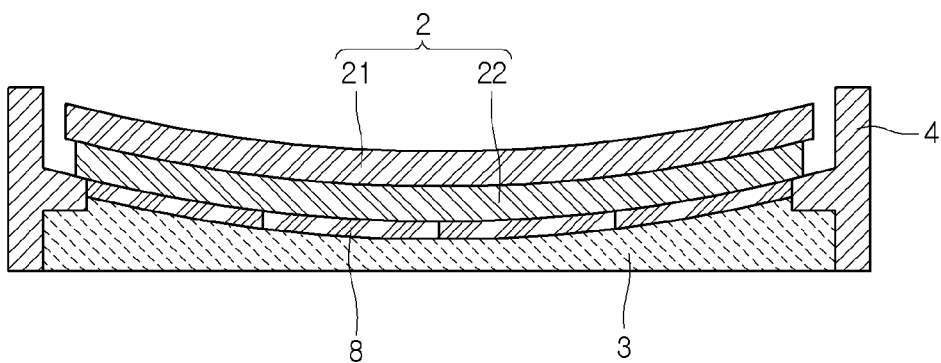

FIGS. 22A and 22B are cross-sectional views showing curved type OLED devices according to an eighth embodiment of the present disclosure.

The OLED device of the eighth embodiment has the same configuration as those of the sixth and seventh embodiments with the exception of having a curved shape. The components of the eighth embodiment having the same function and shape as those of the sixth and seventh embodiments will be referred to by the same reference numbers and names. Also, the description of the eighth embodiment overlapping with the sixth and seventh embodiments will be omitted.

Referring to FIG. 22A, the OLED device according to an eighth embodiment of the present disclosure can include: an OLED panel 2 with a first curvature; an upper cover 1 configured to have the first curvature and support the OLED panel 2 in an upper direction; a bottom cover 3 disposed under the OLED panel 2 and configured to support the OLED panel 2; and the side cover 4 configured to associate with the bottom cover 3 and support the OLED panel 2. The bottom cover 3 has a second curvature.

A third magnet 8 can be disposed on the upper surface of the bottom cover 3. The magnetic force of the third magnet 8 can fasten the OLED panel 2 to the bottom cover 3. The third magnet 8 can have a third curvature.

Alternatively, the third magnet 8 can be used in such a manner as to be divided into a plurality of magnetic pieces. In this case, the plurality of third magnets 8 can be arranged on the upper surface of the bottom cover 3.

Although the third magnets 8 are arranged on the upper surface of the bottom cover 3 as shown in FIG. 22A, they can be inserted into the concave portions 39 of the bottom cover 3 as disclosed in the above-mentioned seventh embodiment.

The first through third curvatures are the same as one another. On the other hand, the rear surface of the bottom cover 3 can be formed to have a flat surface not curved, as shown in FIG. 22B.

In this manner, the OLED devices according to the embodiments of the present disclosure enable the OLED panel 2 and the bottom cover 3 to be combined with each other by the magnetic force of the magnet. If it is a misaligned fault at the combination of the OLED panel 2 and the bottom cover 3, the bottom cover 3 and the OLED panel 2 can be easily separated from each other and re-combined with each other after their realignment. Also, when any one of the bottom cover 3 and the OLED panel 2 has a defect, the defective one can be easily replaced by a normal good.

As described above, the OLED devices according to embodiments of the present disclosure uses magnets instead of the double-sided tape in order to combine the OLED panel and the bottom cover with each other. As such, the manufacturing process of the OLED device can be simplified. Also, it is easy to disassemble and recombine parts of the OLED device from and with one another when a fault is generated in any component during a manufacturing process. In accordance therewith, the manufacturing process can be simplified and the faulty component can be easily replaced with a normal component. As a result, the manufacturing costs of the OLED device can be reduced. Moreover, it is possible to prevent misalignment which can be generated at the combination of the OLED panel and the bottom cover in a curved type OLED device.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. An organic light emitting display device comprising:
   a display panel configured to include a substrate and a sealing member;
   a bottom cover disposed under the display panel and configured to support the display panel; and
   at least one first magnet disposed on or within the bottom cover in order to fasten the display panel to the bottom cover,
   wherein the sealing member is formed from a metal material.

2. The organic light emitting display device of claim 1, further comprising:
   a side cover combined with the bottom cover and disposed around the bottom cover.

3. The organic light emitting display device of claim 1, further comprising:
   an upper cover configured to protect upper edges of the display panel.

4. The organic light emitting display device of claim 1, wherein the first magnet covers the whole upper surface of the bottom cover.

5. The organic light emitting display device of claim 1, wherein a plurality of first magnet cover the whole upper surface of the bottom cover.

6. The organic light emitting display device of claim 1, wherein the first magnet has a shape of rectangular.

7. The organic light emitting display device of claim 1, wherein one side of the first magnet is attached to the bottom cover by using adhesive layer, and the other side of the first magnet is adhered to the sealing member by magnetic force.

8. The organic light emitting display device of claim 1, wherein the bottom cover includes:
   at least one first hole formed in a lower surface of the bottom cover; and
   at least one second hole connected with the at least one first hole and formed in an upper surface of the bottom cover, and
   wherein the first magnet is inserted into the first hole.

9. The organic light emitting display device of claim 8, wherein the second hole is formed in a smaller size than that of the first hole.

10. The organic light emitting display device of claim 8, wherein the first magnet is formed in a shape matching with the first hole.

11. The organic light emitting display device of claim 8, wherein the first hole is formed in a screw shape and the first magnet is formed in a screw shape matching with the screw shape of the first hole.

12. The organic light emitting display device of claim 8, wherein the bottom cover further includes at least one magnet cover disposed to fasten the at least one magnet which is inserted into the at least one first hole.

13. The organic light emitting display device of claim 8, wherein one or more second magnet is disposed at a position of the upper surface of the bottom cover matching with the first magnet.

14. The organic light emitting display device of claim 1, wherein the bottom cover includes at least one first concave portion formed in a lower surface of the bottom cover, and the at least one first magnet is inserted into the at least one first concave portion.

15. The organic light emitting display device of claim 14, wherein the first magnet is formed in a shape matching with the first concave portion.

16. The organic light emitting display device of claim 14, wherein the first concave portion is formed in a screw shape and the first magnet is formed in a screw shape matching with the screw shape of the first concave portion.

17. The organic light emitting display device of claim 1, wherein the display panel is curved in a pre-determined curvature.

18. The organic light emitting display device of claim 14, wherein the bottom cover is curved in the same curvature as the display panel.

19. The organic light emitting display device of claim 14, wherein the bottom cover includes:
    an upper surface curved in the same curvature as the display panel; and
    a lower surface formed to maintain a consistent horizontality.

20. The organic light emitting display device of claim 1, wherein the first magnet includes graphite.

\* \* \* \* \*